(12) United States Patent
Yang et al.

(10) Patent No.: US 7,746,706 B2
(45) Date of Patent: Jun. 29, 2010

(54) METHODS AND SYSTEMS FOR MEMORY DEVICES

(75) Inventors: Nian Yang, Mountain View, CA (US);
Yonggang Wu, Santa Clara, CA (US);
Tien-Chun Yang, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 611 days.

(21) Appl. No.: 11/639,935

(22) Filed: Dec. 15, 2006

(65) Prior Publication Data

US 2008/0144391 A1    Jun. 19, 2008

(51) Int. Cl.
*G11C 16/04* (2006.01)

(52) U.S. Cl. .................... 365/185.3; 365/185.31; 365/185.09

(58) Field of Classification Search .......... 365/185.3, 365/185.31, 185.19
See application file for complete search history.

(56) References Cited

U.S. PATENT DOCUMENTS

| | | | | |
|---|---|---|---|---|
| 5,576,992 A | * | 11/1996 | Mehrad | 365/185.24 |
| 5,912,845 A | * | 6/1999 | Chen et al. | 365/185.3 |
| 6,496,417 B1 | * | 12/2002 | Shiau et al. | 365/185.2 |
| 6,894,925 B1 | | 5/2005 | Park et al. | |
| 7,099,204 B1 | | 8/2006 | Wadhwa et al. | |
| 7,120,063 B1 | | 10/2006 | Liu et al. | |
| 2002/0008996 A1 | | 1/2002 | Hirano | |
| 2003/0218913 A1 | | 11/2003 | Le et al. | |
| 2004/0184320 A1 | | 9/2004 | Yang et al. | |
| 2008/0117684 A1 | * | 5/2008 | Hemink | 365/185.19 |

FOREIGN PATENT DOCUMENTS

| WO | WO 98/10424 A | 3/1998 |
|---|---|---|
| WO | WO 01/24267 A | 4/2001 |

OTHER PUBLICATIONS

PCT International Search Report dated Apr. 22, 2008 issued to PCT No. PCT/US2007/086647.

* cited by examiner

*Primary Examiner*—Vu A Le
*Assistant Examiner*—Han Yang
(74) *Attorney, Agent, or Firm*—Eschweiler & Associates, LLC

(57) ABSTRACT

One embodiment of the invention relates to a method for accessing a memory cell. In this method, at least one bit of the memory cell is erased. After erasing the at least one bit, a soft program operation is performed to bias the memory cell thereby improving the reliability of data stored in the memory cell.
Other methods and systems are also disclosed.

12 Claims, 10 Drawing Sheets

METHODS AND SYSTEMS FOR MEMORY DEVICES

FIELD OF INVENTION

The present invention relates generally to semiconductor devices and more particularly to improved methods and systems for semiconductor memories.

BACKGROUND OF THE INVENTION

Many different types of memory exist to store data for computers and other digital devices. Flash memory is one type of memory that has become popular because it combines the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc., as well as in many larger electronic systems, such as cars, planes, industrial control systems, etc.

FIG. 1 shows one example of a dual-bit flash memory cell 100, which is a memory cell is essentially split into two identical (mirrored) parts, each of which is formulated for storing one of two independent bits. Thus, one bit of data can be independently stored in one of two storage regions 102, 104. The dual bit memory cell, like a traditional single bit flash memory cell, has a wordline (WL) 106 associated with a source 108 and a drain 110. Like a traditional single bit flash memory cell, a channel region 112 may exist under the wordline between the source and drain.

A stacked gate structure 114, which may include a multi-level dielectric layer 116 and the wordline 106, is formed over the semiconductor substrate or p-well 118. The multi-level dielectric layer 116 can generally be composed of three separate layers: a first insulating layer 120, a charge-trapping layer 122, and a second insulating layer 124. The wordline 106 is formed over the multi-layer dielectric layer 116.

In FIGS. 2A-2D, a prior art method 200 for performing a memory operation on the dual-bit memory cell 100 is described with reference to a flow diagram (FIG. 2A) and schematic representations (FIGS. 2B-2D). The illustrated flow diagram (FIG. 2A) shows general functional steps, while the schematic representations (FIG. 2B-2D) show various bias conditions applied on a dual-bit cell and movement of charged carriers (i.e., holes p+, and/or electrons n−) at various blocks of the method 200.

As shown in FIG. 2A, the method 200 proceeds differently depending on whether a user is programming the memory cell or erasing the memory cell. If the operation is a program operation ("PROGRAM" at 202), the method 200 proceeds to block 204 wherein one bit of the memory cell is programmed. Conversely, if the operation is an erase operation ("ERASE" at 202), the method proceeds to block 206 wherein one bit of the memory cell is erased.

After the right bit of the cell is programmed (FIG. 2B, 204A) and/or the left of the cell is programmed (FIG. 2C, 204B), a user may want to erase either bit of data in the cell. Referring now to FIG. 2D, one can see an erase operation 206 in accordance with the prior art, wherein the right bit of the cell is erased. A relatively high voltage (6V) is applied to the drain, and the wordline WL is held at a negative voltage (−6V), while the source is allowed to float. Under these conditions, a strong electric field is developed across the multi-layer dielectric 116 between the wordline and the drain. The negatively charged electrons that are trapped in the charge trapping layer 122 are attracted to the positive voltage on the drain, while positively charged holes flow from the substrate or p-well 118 into the charge trapping layer 122, both by way of Fowler-Nordheim tunneling through the tunnel oxide 120. As the electrons are removed from the charge trapping layer and holes flow into the charge trapping layer, the cell is erased.

One shortcoming of the prior art method 200 is that hot-carriers (e.g., accelerated carriers) are difficult to precisely control. Thus, for example, while the cell is erased, an excess number of holes may be injected into the charge trapping layer 122 or an excess number of electrons may be removed from the charge trapping layer. In either case, the voltage threshold of the cell may differ from an expected threshold value, causing the data stored in the cell to be less reliable. Therefore, during a subsequent read operation, the cell may provide a different current from the drain to source then expected. Because the current level may be indicative as to the data value stored in the cell, the cell will return unreliable data.

Therefore, a need has arisen to provide systems and methods relating to memory devices that cure some deficiencies of the prior art.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment of the invention relates to a method for accessing a memory cell. In this method, at least one bit of the memory cell is erased. After erasing the at least one bit, a soft program operation is performed to bias the memory cell thereby improving the reliability of data stored in the memory cell.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
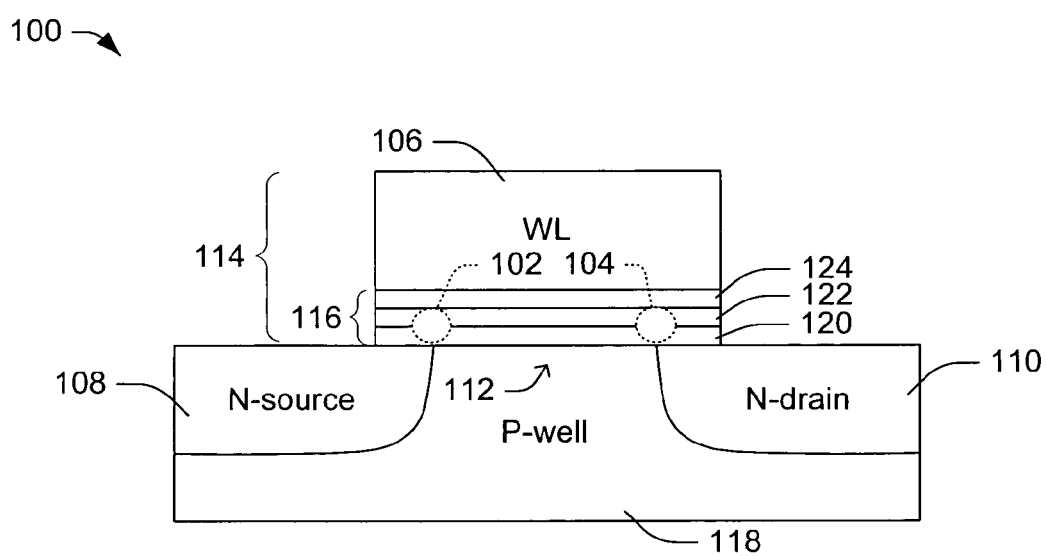
FIG. 1 shows a flash memory cell in accordance with the prior art.
Figure 2A:
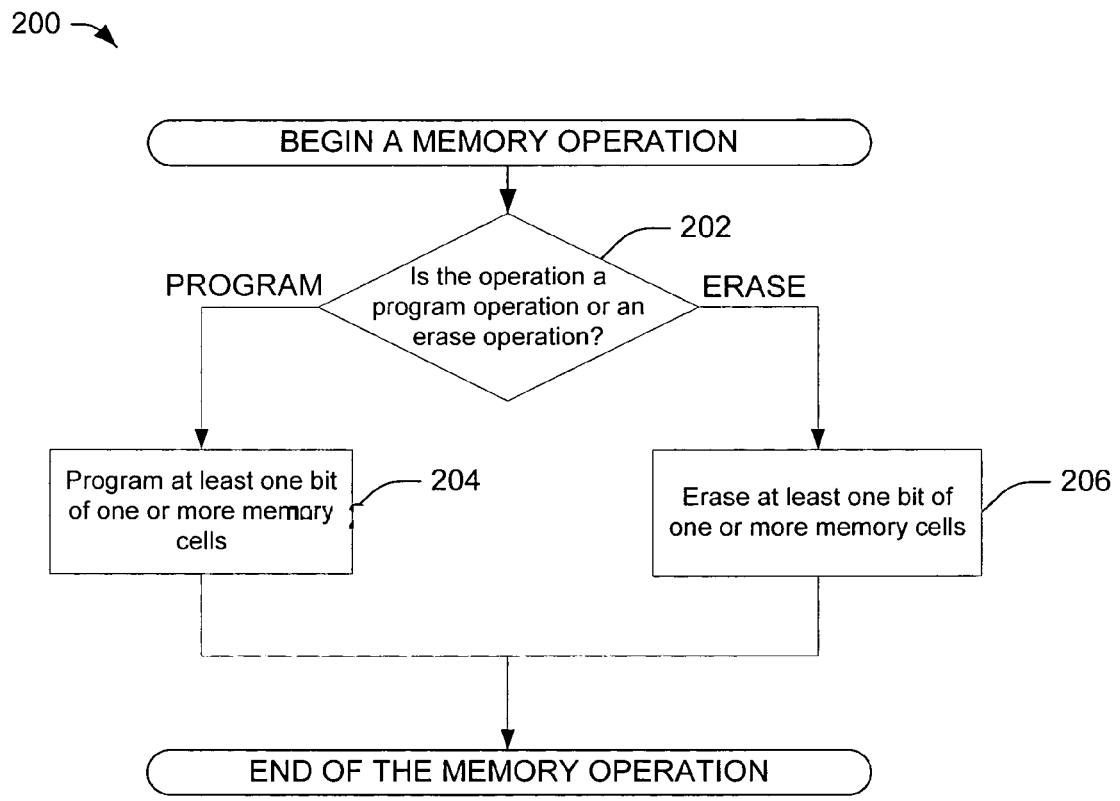
FIG. 2A shows a method for accessing memory in accordance with the prior art.
Figure 2B:
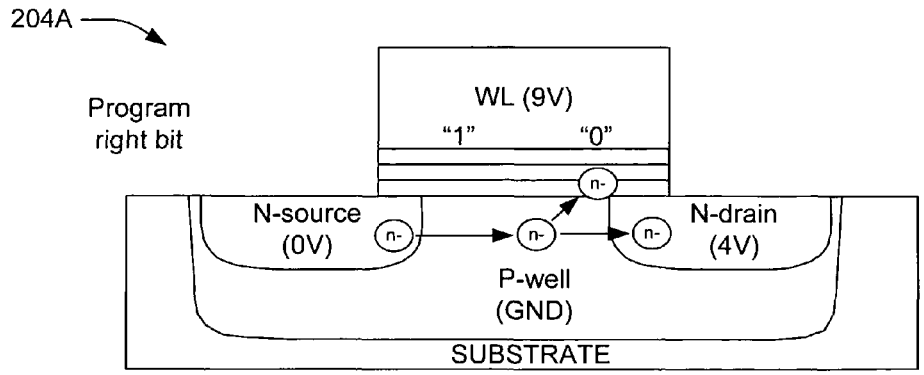
FIG. 2B-2D show schematic illustrations of a flash memory cell while being accessed in accordance with the prior art.
Figure 2C:
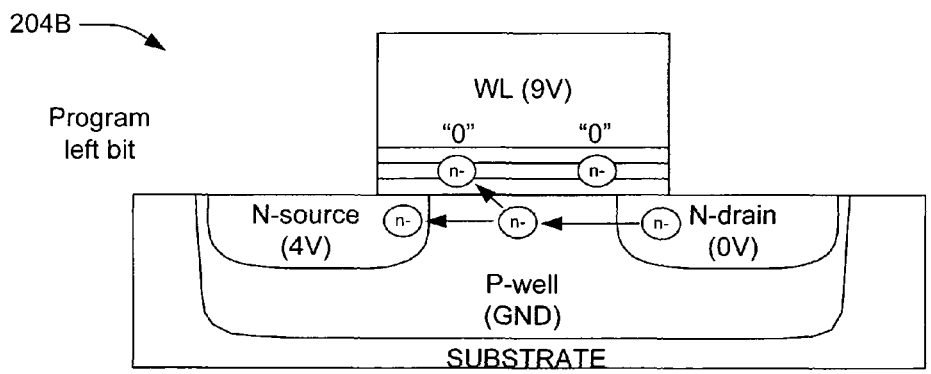
Figure 2D:
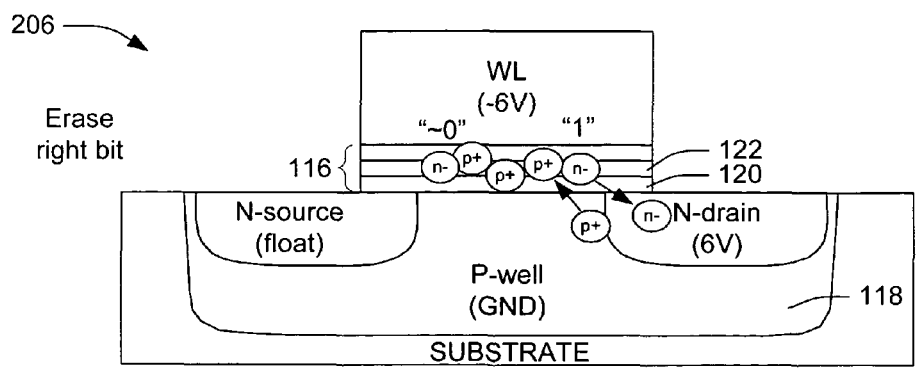

One or more implementations of the present invention will now be described with reference to the attached drawings, wherein like reference numerals are used to refer to like elements throughout. The drawings are not necessarily drawn to scale.

Figure 3:
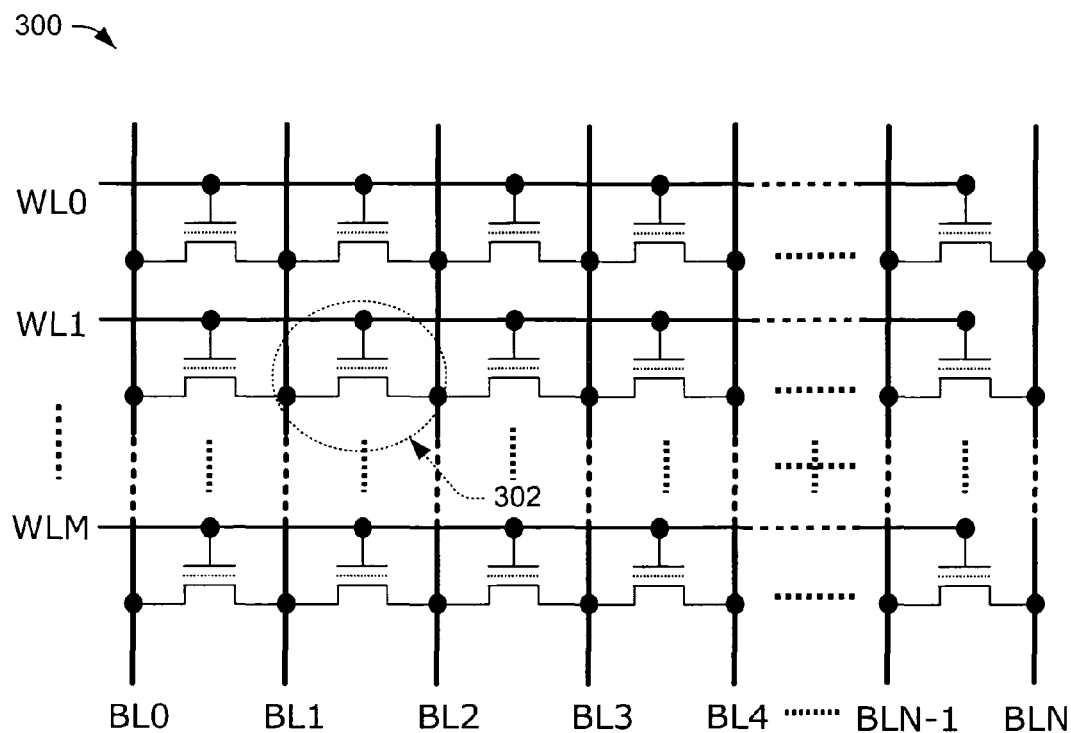
FIG. 3 shows one embodiment of a memory array.

Referring now to FIG. 3, one can see a memory array 300 in accordance with one embodiment of the present invention. In one embodiment, the memory array can comprise flash memory cells, although it will be appreciated that the invention applies to single-bit flash memory cells, dual-bit flash memory cells, multi-bit flash memory cells, EEPROM, EPROM, SRAM, DRAM, or other types of memory cells. In the illustrated embodiment, dual-bit flash memory cells 302 can be arranged such that the bit lines (BL0, BL1, . . . BLN) run vertically parallel to one another and wherein wordlines (WL0, WL1, . . . WLM) run perpendicular to the bit lines. Thus, unlike a traditional single bit flash memory cell in which the source is always connected to an electrical source and the drain is always connected to an electrical drain, respective dual bit memory cells can have the connections of the source and drain reversed during operation to permit the storing of two bits.

Figure 4:
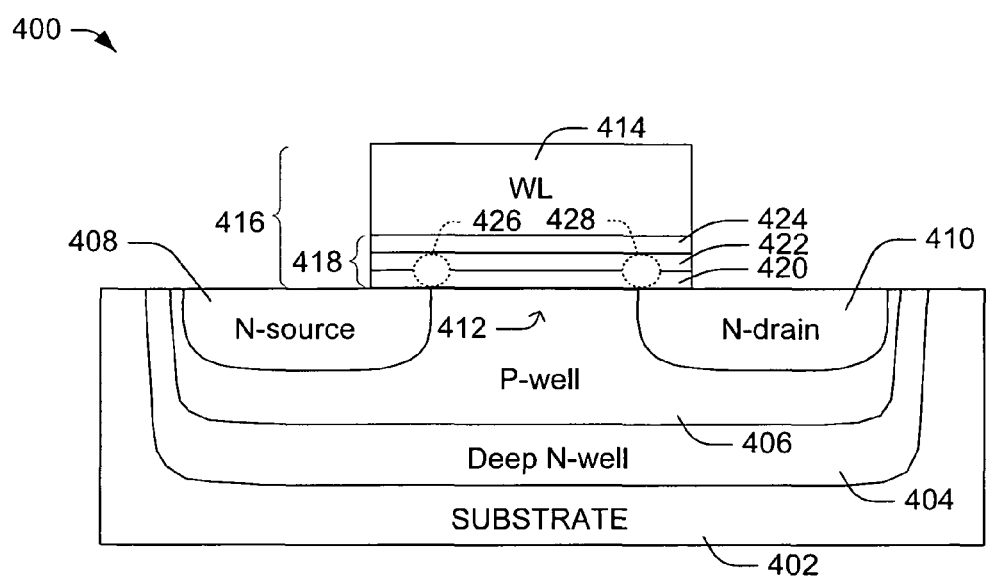
FIG. 4 shows one embodiment of a memory cell.

Referring now to FIG. 4, one can see a dual bit flash memory cell 400 in accordance with aspects of the present invention. The illustrated dual bit memory cell is formed on or over a semiconductor substrate 402 with a deep n-well 404, inside of which a p-well 406 is formed. The deep n-well 404 may be biased relative to the p-well 406 to prevent leakage from the memory cell. N-type conductive bitlines 408, 410 that may interchangeably act as a source or drain are implanted in the p-well. A channel region 412 may exist under the wordline WL 414 between the bitlines 408, 410.

A stacked gate structure 416, which may include a multi-level dielectric layer 418 and the wordline 414, may be formed over the substrate 402. The multi-level dielectric layer 418 can generally be composed of three separate layers: a first insulating layer 420, a charge-trapping layer 422, and a second insulating layer 424. Programming circuitry controls two bits 426, 428 per cell by selectively biasing the wordlines, bitlines, p-well, and deep n-well to achieve more reliable data storage than was available by using prior art techniques.

Figure 5A:
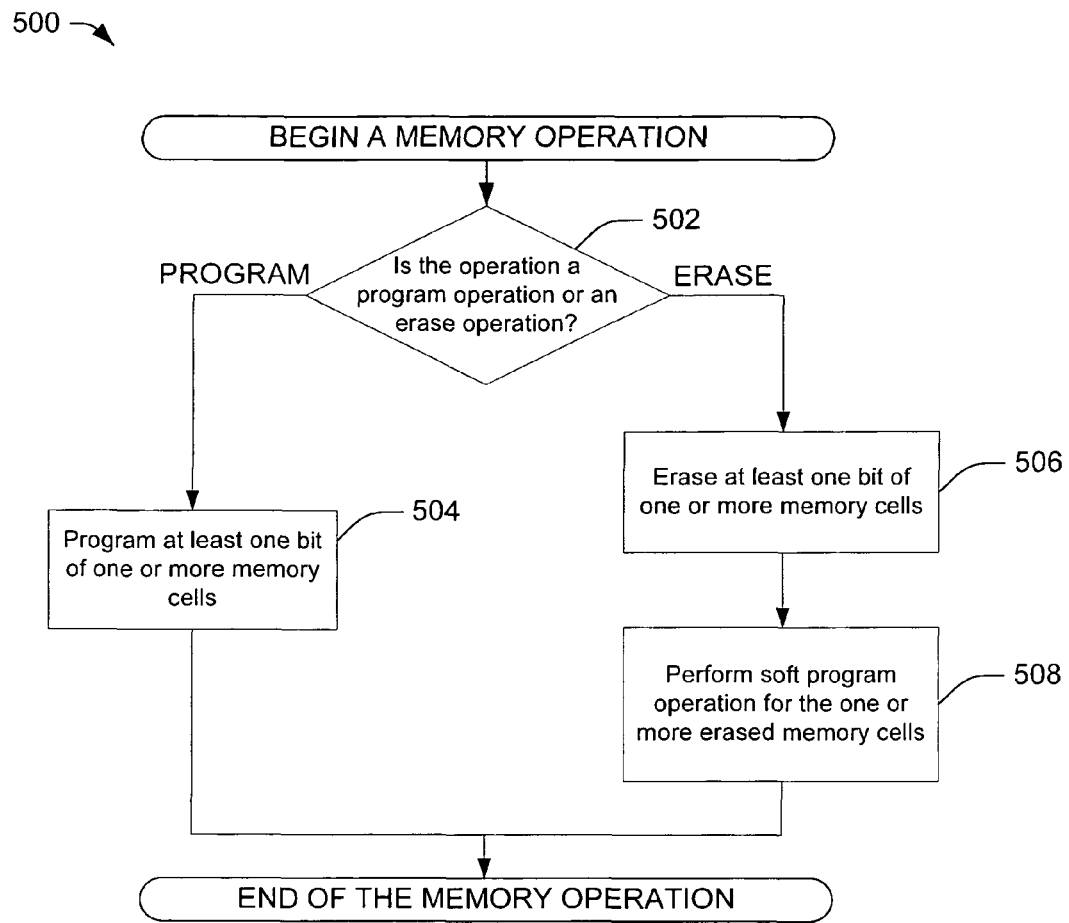
FIG. 5A shows one embodiment of a method for accessing memory.
Figure 5B:
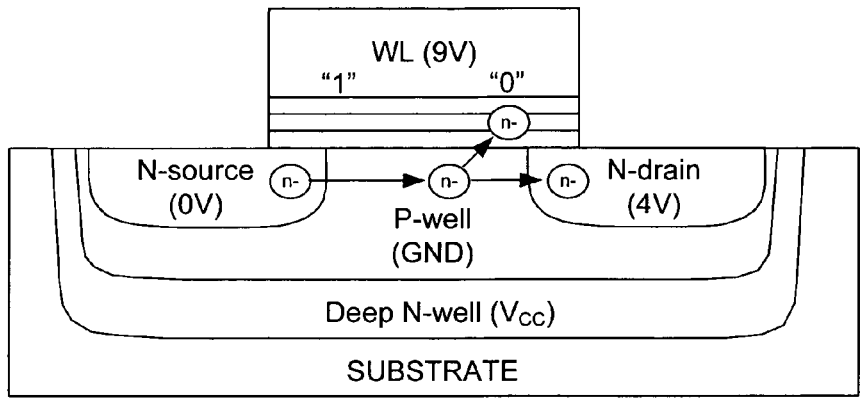
FIG. 5B-5F show schematic illustrations of embodiments of a flash memory cell while being accessed.

One embodiment of a method for accessing a memory cell in accordance with the present invention is illustrated in FIG. 5A-5F. More particularly, the method 500 is described with reference to a flow diagram (FIG. 5A) and schematic representations (FIGS. 5B-4F). The illustrated flow diagram (FIG. 5A) shows general functional steps, while the schematic representations (FIG. 5B-5F) show various aspects of the memory cell during the various stages of the method.

While the method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated. For example, although the schematic representations show a dual-bit flash memory cell as previous described, it will be appreciated that the aspects of the invention may also apply to single-bit flash memory cells, multi-bit flash memory cells, EEPROM, EPROM, SRAM, DRAM, or other types of memory.

Referring now to FIG. 5A, one can see one method 500 for performing a memory operation. The method 500 proceeds according to different blocks depending on whether the memory operation is a program operation or an erase operation. If the operation is a programming operation ("PROGRAM" at 502), the method proceeds to block 504 wherein at least one bit of one or more memory cells are programmed. Conversely, if the operation is an erase operation ("ERASE" at 502), then the method proceeds to block 506 and at least one bit of one or more memory cells is erased. After the erasure takes place, the method 500 then proceeds to block 508 wherein a soft program operation is performed on one or more of the erased memory cells. In one embodiment, a soft program operation selectively biases the cell to improve the reliability of data stored in the memory cell.

FIG. 5B illustrates one embodiment 504A for programming one bit of a dual bit memory cell. A relatively high voltage (e.g., which may range from approximately 0V to approximately 10V in various embodiments, or other voltages depending on the implementation) is applied to the wordline WL while a relatively low voltage (e.g., GND) is applied to the p-well, thereby freeing charged carriers from the lattice in the channel of the p-well. Meanwhile, the source is connected to ground and the drain is connected to a predetermined potential above ground (e.g., which may range from approximately 0V to approximately 10V in various embodiments, or other voltages depending on the implementation), resulting in a potential difference between the source and drain. Due to this potential difference, the charged carriers in the channel are accelerated between the source and drain. Due to a high electric field across the tunnel oxide, negatively charged electrons are attracted to the positively charged wordline WL, leading to Fowler-Nordheim tunneling. During this process, electrons in the channel tunnel through the gate oxide into the charge trapping dielectric layer and become trapped in the right bit position in the charge trapping dielectric layer since it is surrounded by the insulating layers. As a result of the trapped electrons, the threshold voltage of the cell increases. This change in the threshold voltage (and thereby the channel conductance) of the cell created by the trapped electrons is what causes the cell to be programmed. During the programming, a high voltage (e.g., Vcc) may be applied to the deep N-well to limit or prevent leakage from the memory device.

Figure 5C:
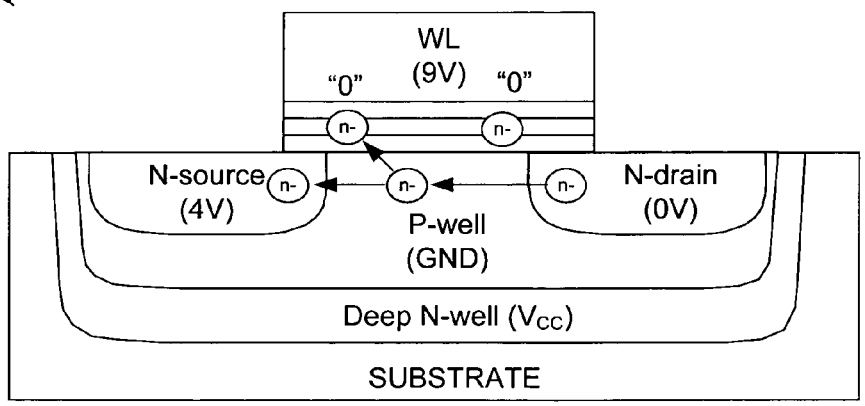

FIG. 5C illustrates another embodiment 504B in which the other bit (i.e., the left bit) of the memory cell is programmed. Although in the illustrated figures the presence of electrons in charge trapping dielectric is representative of a "0" data value, other conventions could also be used. For example, the presence of electrons could be representative of a "1" data value. Thus, although the illustrated figures show programming as writing "0" data values to the cell, programming could also write "1" data values to the cell, depending on the convention used. Similarly, erasing a bit could also write "0" or "1" values to the cell, depending on the convention used.

Figure 5D:
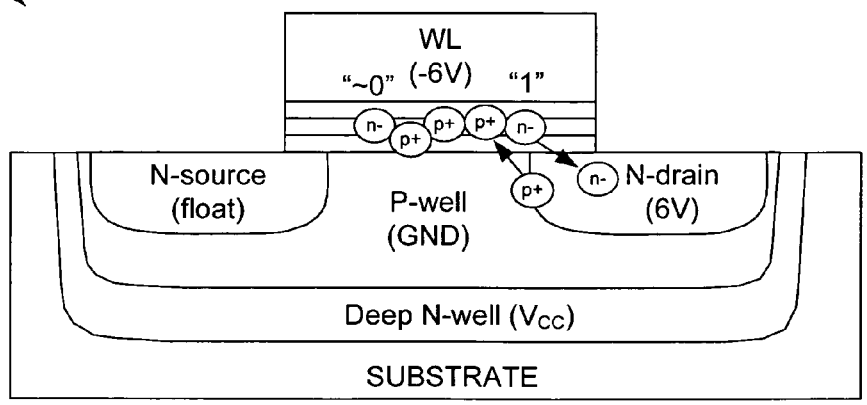

Referring now to FIG. 5D, one can see an erase operation 506 in accordance with aspects of the invention, wherein the right bit of the cell is erased. Although not shown, the left bit could also be similarly erased. In general, during erasure a number of charged carriers (i.e., electrons or holes) are injected into charge trapping layer 422 to adjust a threshold voltage of the memory cell. In the illustrated embodiment, a relatively high voltage (which may range from approximately 0V to approximately 10V in various embodiments, or other voltages depending on the implementation) is applied to the drain, and the wordline WL is held at a negative potential (which may range from approximately 0V to approximately 10V in various embodiments, or other voltages depending on the implementation), while the source is allowed to float. Under these conditions, a strong electric field is developed across the charge trapping dielectric layer between the wordline and the drain. The negatively charged electrons that are trapped in the charge trapping dielectric layer are attracted to the positive voltage on the drain, while positively charged holes flow from the substrate into the charge trapping dielectric layer, both by way of Fowler-Nordheim tunneling through the tunnel oxide. As the electrons are removed from the charge trapping layer and holes flow into the charge trapping layer, the cell is erased.

As previously mentioned, this erasing procedure can lead to hot-carrier injection whereby excess holes are injected into the charge trapping dielectric layer, causing the voltage threshold for the cell to be lower than expected. Because these hot-carriers are difficult to precisely control, a wide voltage threshold variation across the memory array has hereforeto made reliable data storage difficult at times.

Figure 5E:
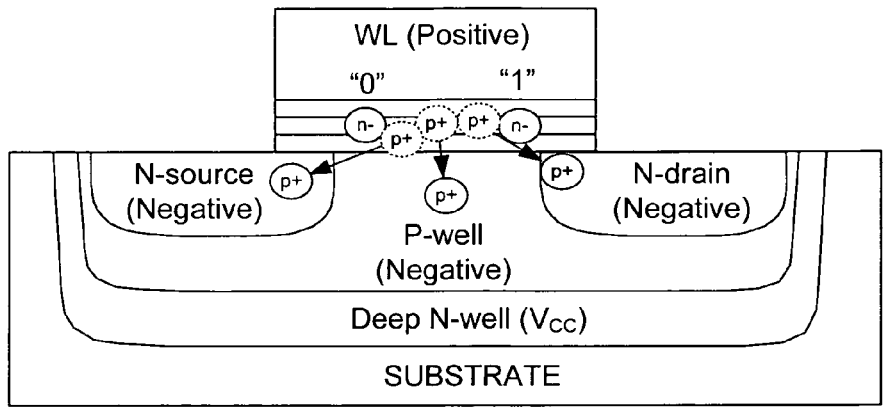
Figure 5F:
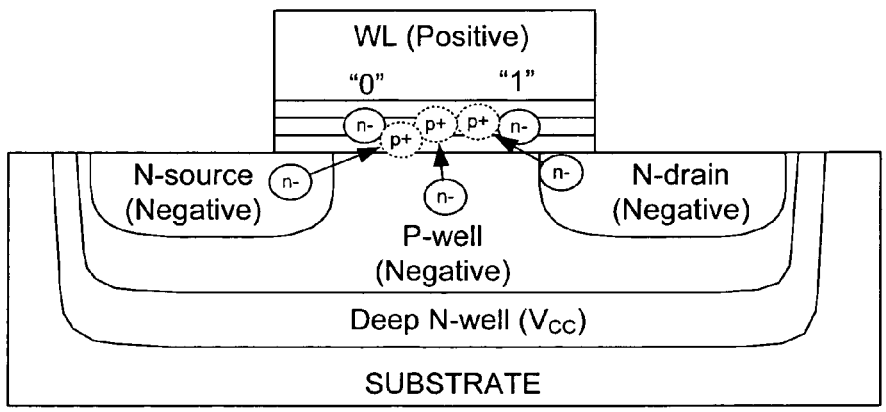

Therefore, the soft program operation can be performed to increase reliable data storage by limiting the effects of hot-carrier injection or otherwise adjusting charge stored in the cell. FIGS. 5E-5F show one embodiment in which a soft program operation is performed on the memory cell. In general, the soft program memory operation selectively biases the memory cell to adjust the number of charged carriers in the charge trapping dielectric layer to more closely track the expected voltage threshold of the memory cell. In other words, a soft program memory operation can make the voltage thresholds of the memory cells in the array more uniform with respect to one another and with respect to the expected voltage threshold.

As shown in FIGS. 5E-5F, a positive voltage is applied to the word line WL while a negative voltage is concurrently applied to the p-well and/or buried bit lines. Thus, the negative voltage attracts holes (p+) to the substrate while the positive wordline attracts electrons (n−), thus reducing the number of hot carriers that were injected into the dielectric charge trapping layer during the erasure. Therefore, the soft program memory operation may allow the device to adjust the number of carriers in the charge trapping layer, thereby tuning the voltage threshold of the cell.

In particular, FIG. 5E shows one mechanism that can contribute to the soft program operation, namely the movement of holes (p+) from the charge trapping diametric layer into the buried bit lines and p-well. FIG. 5F shows another mechanism that can contribute to the soft program operation, namely the movement of electrons (n−) from the buried bit-lines and p-well into the charge trapping layer.

Figure 6:
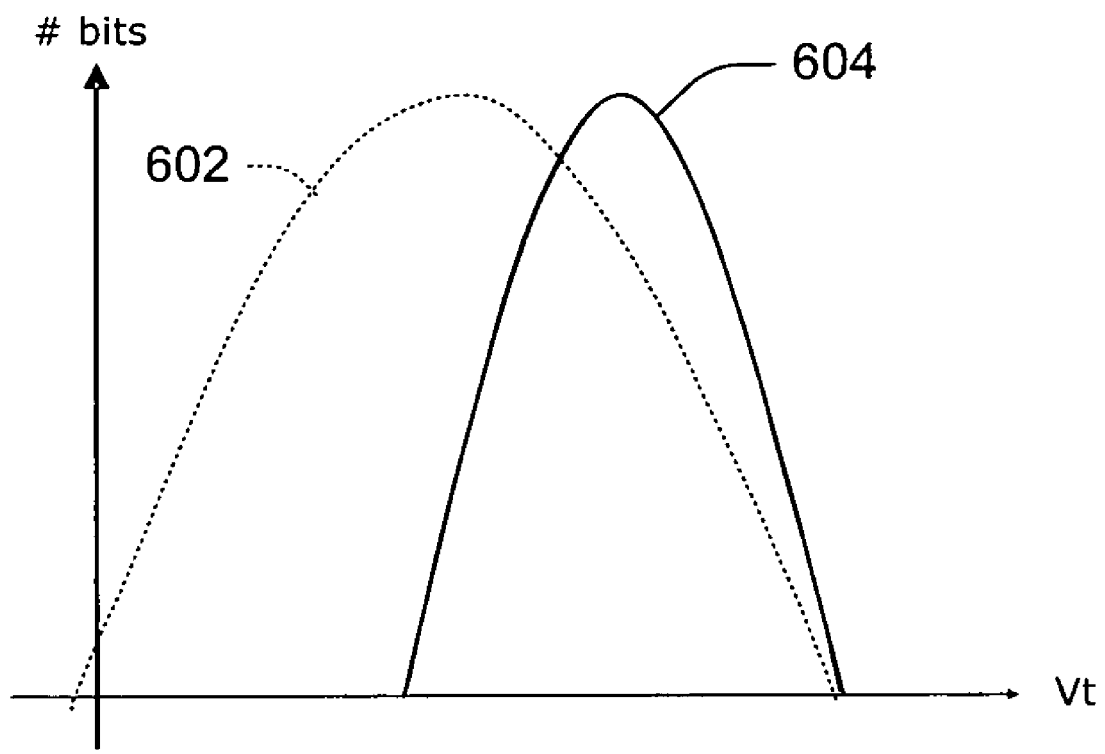
FIG. 6 shows one embodiment of how a threshold distribution can be improved over the prior art.
Figure 7:
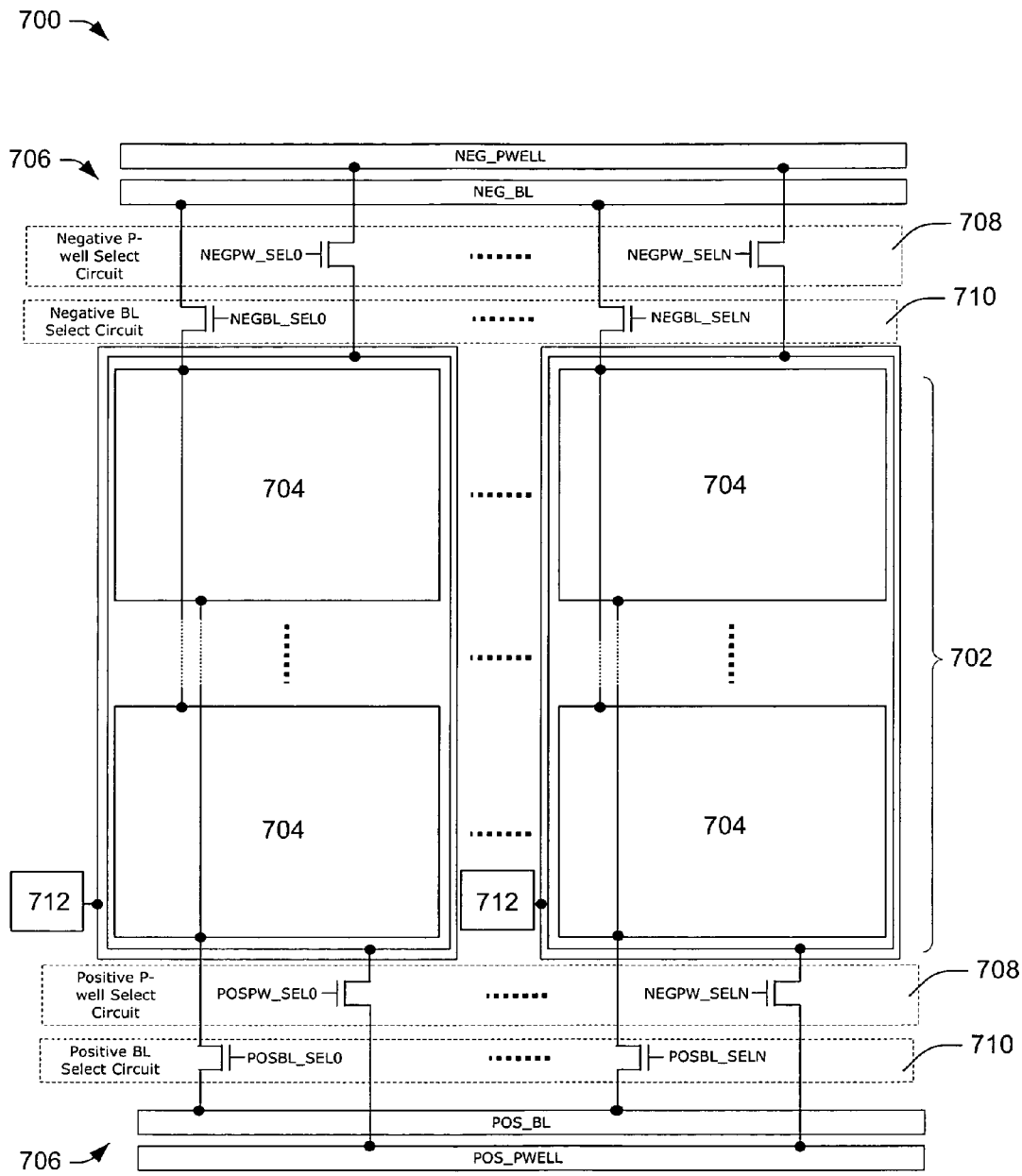
FIG. 7 shows one embodiment of a memory device.

Thus, as shown in FIG. 6, in one embodiment the voltage threshold distribution 600 across the memory array may vary, depending on whether the soft program operation is utilized. As shown, the voltage threshold distribution of the prior art 602 is relatively wide and the soft program voltage threshold distribution 604 is comparatively narrow. As shown, the soft program voltage threshold 604 is shifted towards a greater voltage threshold, because the charge trapping dielectric layer no longer has the excess holes. Therefore, the soft program operation advantageously "compacts" the voltage threshold distribution across the memory array thereby improving data reliability FIG. 7 shows a memory device comprising a memory array 702, under which one or more wells 702, such as a p-well, exist. A deep-well, such as a deep n-well, may exist under the one or more wells 702. The memory cells of the memory array may be partitioned into sections 704, wherein bit lines run vertically over the sections and wordlines run horizontally over the sections. Thus, each section could correspond to a memory array as shown in FIG. 3.

The memory device further comprises programming circuitry 706 to selectively bias one or more of the memory cells in the memory array. The programming circuitry 706 may comprise well selection circuitry 708 configured to selectively bias the well to a positive voltage or negative voltage. In the illustrated embodiment, the well selection circuitry is partitioned into a top portion and the bottom portion.

In one more embodiments, the programming circuitry 706 may further comprise bit line selection circuitry 710 configured to selectively bias at least one of the buried bit lines to a positive or negative voltage, depending on the memory operation. Again, in the illustrated embodiment the bit line selection circuitry 710 is partitioned into a top portion and the bottom portion.

The programming circuitry 706 may further comprise deep well biasing circuitry 712. In one embodiment, the deep well biasing circuitry can apply a high voltage (e.g., $V_{cc}$) to a deep well (e.g, deep n-well).

In various embodiments programming circuitry 706 is configured such that the well, the deep-well, and/or the bit lines can be biased independently of one another to facilitate desired functionality, such as a soft program operation or other operations.

Although, one memory cell and a method for performing operations thereon has been illustrated and described, alterations and/or modifications may be made to the illustrated examples without departing from the spirit and scope of the appended claims. For example, although the memory cell has been shown with as having an n-type deep-well, a p-type well, and n-type source and drain; in other embodiments of doping conventions could be reversed. For example, the deep well could be p-type, the well could be n-type, and the source and drain could be p-type. In describing the illustrated memory cell, reference was made to positive and negative voltages, which may more generally be referred to as a first polarity and a second polarity, or vice versa. In embodiments where the doping conventions are reversed, it will be appreciated that the polarities could also be reversed from one as shown in the figures. Thus, in such embodiments, opposite polarities would likely be applied to the respective regions in order to facilitate desired functionality.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for accessing a flash memory cell, comprising:
   erasing at least one bit of the memory cell while applying a first channel voltage to a p-well of the memory cell; and
   after erasing the at least one bit of the memory cell, performing a soft program operation by applying a second channel voltage to the p-well while concurrently applying a wordline voltage to a wordline coupled to the at least one memory cell, where the second channel voltage is less than the first channel voltage and where the wordline voltage is greater than the first channel voltage.

2. The method of claim 1, wherein erasing the at least one bit comprises:
   injecting a number of charged carriers into a charge trapping dielectric layer of the memory cell to adjust a threshold voltage of the memory cell.

3. The method of claim 2, wherein performing a soft program operation comprises:
   adjusting the threshold voltage of the memory cell by biasing the memory cell to adjust the number of charged carriers in the charge trapping dielectric layer.

4. The method of claim 3, wherein the memory cell is a flash memory cell.

5. The method of claim 3, wherein the memory cell is a flash memory cell that is configured to store at least two bits of data.

6. A method for accessing a flash memory cell having a channel region disposed between a source and a drain, and a wordline disposed over the channel region, the method comprising:
   erasing a bit of the flash memory cell by applying a voltage of approximately zero volts to the channel region while concurrently applying a first negative wordline voltage to the wordline; and
   improving the reliability of data stored in the flash memory cell by applying a second positive wordline voltage to the wordline while concurrently applying a second negative channel voltage to the channel region.

7. The method of claim 6, wherein improving the reliability of the data further comprises at least one of:
   applying a negative source voltage to the source; or
   applying a negative drain voltage to the drain.

8. The method of claim 7, further comprising:
   applying a positive voltage to a deep-well that electrically isolates the channel region from a substrate on which the flash memory cell is formed.

9. The method of claim 6, further comprising:
   programming the bit of the flash memory cell by applying a third positive wordline voltage to the wordline while concurrently applying a source-drain voltage between the source and drain.

10. The method of claim 9, further comprising:
    applying a positive voltage to a deep-well that electrically isolates the channel region from a substrate on which the flash memory cell is formed.

11. A method for accessing a memory cell having a channel region disposed between a source and a drain, and a wordline disposed over the channel region, the method comprising:
    programming a bit of the memory cell by applying a first channel voltage of approximately zero volts to the channel region while concurrently applying a first positive wordline voltage to the wordline;
    erasing the bit of the memory cell by applying the first channel voltage to the channel region while concurrently applying a first negative wordline voltage to the wordline;
    improving the reliability of data stored in the memory cell by applying a second positive wordline voltage to the wordline while concurrently applying a second channel voltage less than the first channel voltage to the channel region.

12. The method of claim 6, further comprising:
    applying a positive voltage to a deep-well that electrically isolates the channel region from a substrate on which the flash memory cell is formed.

* * * * *